United States Patent [19]

Plants

[11] Patent Number: 4,958,132
[45] Date of Patent: Sep. 18, 1990

[54] COMPLEMENTARY METAL-OXIDE-SEMICONDUCTOR TRANSLATOR

[75] Inventor: William C. Plants, Santa Clara, Calif.

[73] Assignee: Advanced Micro Devices, Inc., Sunnyvale, Calif.

[21] Appl. No.: 349,116

[22] Filed: May 9, 1989

[51] Int. Cl.⁵ .............................................. H03F 1/34
[52] U.S. Cl. .................................... 330/110; 307/548; 330/264
[58] Field of Search ................. 330/110, 264; 307/469, 307/475, 546–548

[56] References Cited

PUBLICATIONS

Kennedy et al., "Active Clamp Circuit Uses Only Two Transistors", *Electronic Design*, 24, Nov. 22, 1969, p. 92.
Grebene, "Bipolar and MOS Analog Integrated Circuit Design", *A Wiley–Interscience Publication*, 1984, Section 6.4, pp. 290–294.
Gregorian et al., "Analog MOS Integrated Circuits for Signal Processing", *A Wiley–Interscience Publication*, 1986, p. 398.

*Primary Examiner*—James B. Mullins
*Attorney, Agent, or Firm*—William J. Benman, Jr.

[57] ABSTRACT

A CMOS translator which includes an amplifier having an input node and an output node; a first clamp for providing a clamped feedback signal from the output node to the input node of the amplifier; and a second clamp for providing a clamped feedforward signal from the input node to the output of the amplifier. ECL signals are translated up to CMOS voltage levels with high speed, low power consumption via a circuit with requires minimal die area. The unique clamping arrangement provides a self-biasing feature which affords a large error margin.

8 Claims, 2 Drawing Sheets

COMPLEMENTARY METAL-OXIDE-SEMICONDUCTOR TRANSLATOR

BACKGROUND OF THE INVENTION

1. Field of the Invention:

The present invention relates to complementary metal-oxide-semiconductor (CMOS) circuits. More specifically, the present invention relates to translators for CMOS circuits.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art:

Complementary metal-oxide-semiconductor (CMOS) technology is used in many current digital applications because of the high switching speeds, low power consumption and small die size requirements associated therewith. Unfortunately, it is often necessary to interface CMOS circuits with circuits fabricated in other technologies. These other technologies include TTL (transistor-transistor logic) and ECL (emitter coupled logic). This may be somewhat problematic for many reasons, not the least of which is the fact that each logic family may operate at unique voltage levels. Such is the case with respect to the ECL family. ECL circuits typically operate with a 600 to 800 millivolt potential differential between logic levels. CMOS circuits generally operate at voltage levels between 0 to 5 volts (0 and 5000 millivolts). Thus, when an ECL signal is input to a CMOS circuit, an interface must be used to amplify the input voltage up to CMOS voltage levels. ECL to CMOS translators serve this purpose.

An ECL to CMOS translator amplifies digital ECL signals to CMOS levels. Unfortunately, prior art ECL/CMOS translators are too slow, consume too much power and are too large for many applications. Thus, there is an ongoing need in the art for faster, smaller ECL/CMOS translators which consume less power than conventional designs.

SUMMARY OF THE INVENTION

The need in the art is addressed by the CMOS translator of the present invention which includes an inverter functioning as an amplifier having an input node and an output node; and a bidirectional clamp for providing a feedback signal from the output node to the input node of the amplifier.

The invention is only part of an ECL to CMOS translator. ECL signals are translated up to CMOS voltage levels with high speed, low power consumption via a circuit with requires minimal die area. The unique clamping arrangement provides a self-biasing feature which affords a large error margin.

DESCRIPTION OF THE INVENTION

Illustrative embodiments and exemplary applications will now be described with reference to the accompanying drawings.

The advantageous design and operation of the CMOS translator of the present invention is best described with reference to the illustrative schematic representation of an unloaded CMOS inverter 10 of FIG. 1(a). As is well known in the art, the CMOS inverter 10 includes a p-channel metal-oxide-semiconductor field effect transistor (MOSFET) 12 and an n-channel MOSFET 14. The gates of the p-channel and the n-channel transistors 12 and 14 are tied to a common input node A. Node A is attached to a source of input voltage $V_{in}$. The source of the p-channel transistor 12 is connected to a source of supply voltage $V_{cc}$. The drain of the p-channel transistor 12 and the drain of the n-channel transistor 14 are tied to a common output node, node B. The source of the n-channel transistor 14 is connected to ground. The output voltage $V_{out}$ is measured with respect to node ground.

In operation, when the voltage of the signal at the input node $V_{in}$ is high, the p-channel transistor 12 is off, the n-channel transistor 14 is on and the output voltage $V_{out}$ is low. When $V_{in}$ is low, the p-channel transistor 12 is on, the n-channel transistor 14 is off and $V_{out}$ is high. Thus, the CMOS pair acts as an inverter.

Figure 1B:
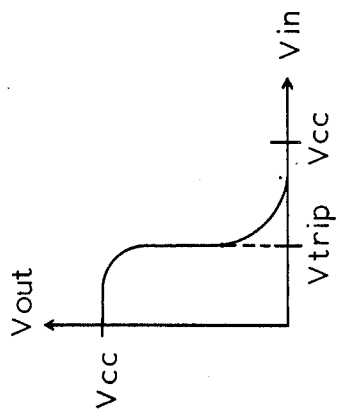
FIG. 1(b) is a graph of the voltage characteristics of the illustrative unloaded CMOS inverter of FIG. 1(a).
Figure 1A:
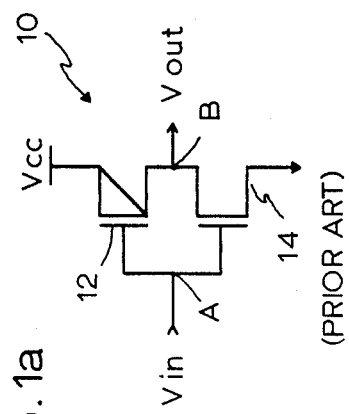
FIG. 1(a) is an illustrative schematic representation of an unloaded CMOS inverter.

As is known in the art and as illustrated in the graph of the voltage characteristics of a CMOS inverter of FIG. 1(b), CMOS inverters have high gain in the region around the trip point $V_{trip}$. This recognition is significant with respect to the realization of the translator of the present invention.

Figure 2B:
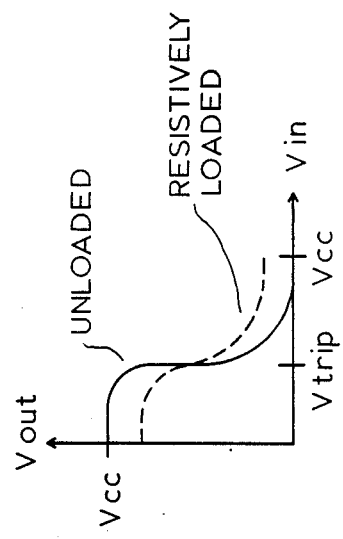
FIG. 2(b) is a graph of the voltage characteristics of the resistively loaded CMOS inverter of FIG. 2(a).
Figure 2A:
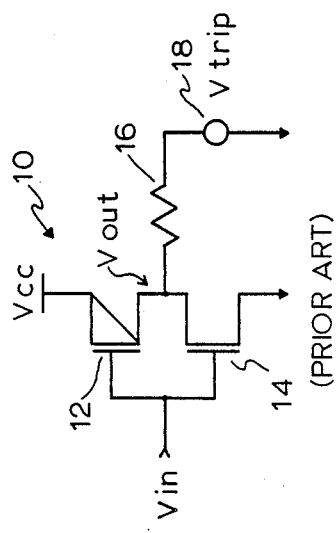
FIG. 2(a) is an illustrative schematic representation of a resistively loaded CMOS inverter.
Figure 3B:
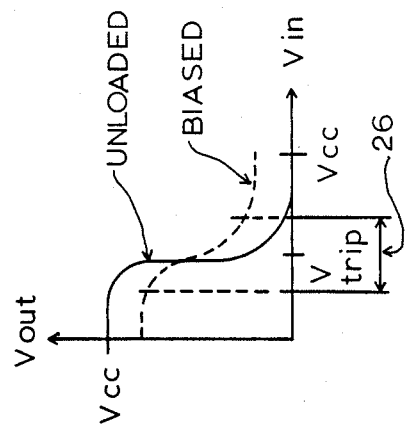
FIG. 3(b) is a graph of the voltage characteristics of the resistively biased CMOS inverter of FIG. 3(a).
Figure 3A:
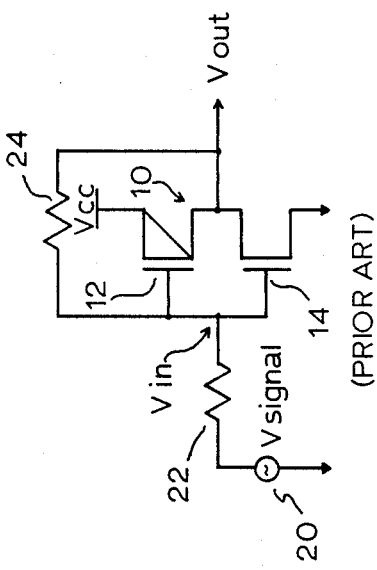
FIG. 3(a) is an illustrative schematic representation of a resistively biased CMOS inverter driven by a non-ideal voltage source.

That is, for the purpose of illustration, one could load the inverter 10 as shown in FIG. 2(a), with a resistor 16 and a voltage source 18 of $V_{trip}$. As illustrated in FIG. 2(b) at the curve labeled "resistively loaded", the result is lower gain and reduced output swing. As shown in FIG. 3(a), if the previous stage can be modeled by a voltage source 20 of $V_{signal}$ in series with a resistor 22 in the desired operating range, a parallel resistor 24 can create the same effect as the resistor 16 and the voltage source 18. As shown as the curve labeled "biased" in the corresponding graph of the voltage characteristics of FIG. 3(b), this resistive biasing limits both the input and output swings and by providing a narrower input operating range 26 effectively self-biases the stage. Note that the voltage gain which is the slope of the transfer characteristic is also reduced.

Figure 4B:
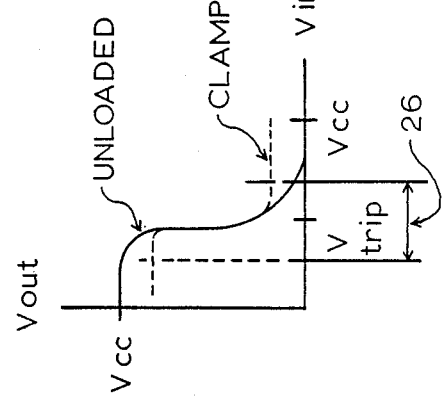
FIG. 4(b) is a graph of the voltage characteristics of the CMOS translator of the present invention.
Figure 4A:
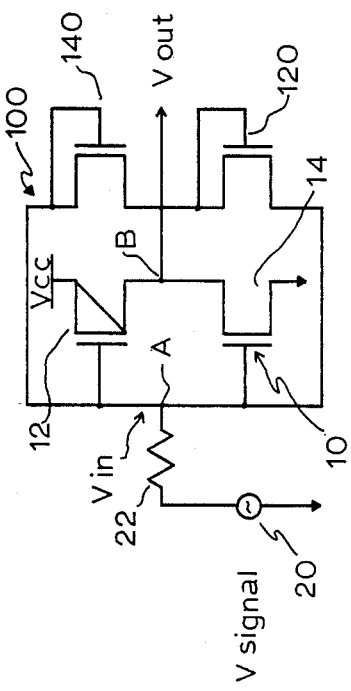
FIG. 4(a) is a schematic diagram showing an illustrative implementation of the CMOS translator of the present invention driven by a non-ideal voltage source.

FIG. 4(a) is a schematic diagram showing an illustrative implementation of the CMOS translator 100 of the present invention. The translator includes the inverter 10 of FIG. 1(a), with a third n-channel MOSFET 120 connected between the output node, node B, and the input node, node A and a fourth n-channel MOSFET 140 connected between the output node, node B, and the input node, node A. The drain and gate of the third n-channel MOSFET 120 are connected to the output node, node B. The source of the third n-channel MOSFET 120 is connected to the input node, node A. Similarly, the drain and gate of the fourth n-channel MOSFET 140 are connected to the input node, node A while the source thereof is connected to the output node, node B. Thus, the third n-channel MOSFET 120 and the fourth n-channel MOSFET 140 provide a feedback path for the inverter 10. The previous stage is modeled by a voltage source 20 and a resistor 22 connected to the input node as in FIG. 3(a).

In operation, the inverter 10 acts as an amplifier providing gain for the translator 100. When the output voltage of the inverter 10 exceeds a threshold equal to the conduction threshold of the third n-channel MOSFET 120 relative to the input voltage, the third n-channel MOSFET 120 conducts and clamps the output of the inverter 10. Similarly, when the input voltage of the inverter 10 exceeds a threshold equal to the conduction threshold of the fourth n-channel MOSFET 140 relative to the output voltage, the fourth n-channel MOSFET conducts and clamps the output of the inverter 10. Thus, the third and fourth MOSFETS 120 and 140 provide a bidirectional clamp for clamping a feedback signal from the output node to the input node of the inverter/amplifier 10.

As is known to those skilled in the art, the supply voltage and the ratio of the sizes of the p-channel and the n-channel transistors 12 and 14 are chosen to provide a gain and output voltage suitable for a particular application or environment.

The curve labeled "clamped" in FIG. 4(b) is a graph of the voltage characteristic of the translator 100 of the present invention. As shown in FIG. 4(b), the use of first and second clamps 120 and 140 in place of the parallel resistor 24 of FIG. 3, provides maximum gain in the operating region, controlled input and output swings and a four transistor self-biasing gain stage with a minimal die size requirement. In particular, the gain is improved relative to the circuit of FIG. 3(a) in the operating region 26 of FIG. 4(b) because the clamps are not engaged in this region. In addition, the clamps hold the input and output voltages close to the trip point. Thus, when it is necessary to trip the next stage, it is not necessary to go al the way from either ground or the power supply to the trip point. This is one factor militating in favor of a short propagation delay.

It is noted that while inverters have been used in the art to provide translation from one logic family to another, the transistors in the inverter may be of substantially different sizes. Thus, the rise time may be much slower than the fall time. Hence, the propagation time was long. Previously, two inverters had to be used in many applications to overcome this problem. One to set the input threshold and one to equalize propagation delays, i.e., to compensate for slow rise time or slew rate. The present invention allows the sizes of the p-channel and the n-channel transistors 12 and 14 to be close thereby affording a high slew rate. The self-biasing feature of the translator 100 allows for a considerable margin of error in the design thereof.

Thus, the present invention has been described herein with reference to a particular embodiment for a particular application. The translator of the present invention may be viewed as an amplifier or inverter with a bidirectional clamp connected between the input and output terminals thereof. While bidirectional clamps may be known in the art, bidirectional clamps have not been known to bias gain stages. Nonetheless, those having ordinary skill in the art and access to the present teachings will recognize additional modifications applications and embodiments within the scope thereof. For example, one or both of the n-channel clamp transistors in the translator of the present invention may be replaced by p-channel transistors and vice versa without departing from the scope of the present invention.

It is therefore intended by the appended claims to cover any and all such applications, modifications and embodiments within the scope of the present invention.

Accordingly,

What is claimed is:

1. A complementary metal-oxide semiconductor translator comprising:
   means for amplifying an input signal having an input node and an output node;
   a first MOSFET transistor connected between said input node and said output node for clamping a first feedback signal from said output node to said input node of said means for amplifying an input signal; and
   second clamp means for clamping a second signal from said input node to said output node of said means for amplifying an input signal.

2. The invention of claim 1 wherein said means for amplifying an input signal is an inverter.

3. The invention of claim 2 wherein said inverter is a CMOS inverter.

4. The invention of claim 3 wherein said CMOS inverter includes two transistors, a p-channel and an n-channel, the source of the p-channel connected to a source of supply, the drain of the p-channel connected to the drain of the n-channel at said output node, the source of the n-channel being connected to ground and the gates of said p-channel and said n-channel transistors being connected to said input node.

5. The invention of claim 1 wherein said second clamp means is a second MOSFET transistor.

6. The invention of claim 5 wherein said first MOSFET transistor is a first CMOS transistor with a gate terminal and a drain terminal connected to said output node and a source terminal respectively connected to said input node.

7. The invention of claim 6, wherein said second MOSFET transistor is a second CMOS transistor with a gate terminal and a drain terminal connected to said input node and a source terminal respectively connected to said output node.

8. A complementary metal-oxide-semiconductor translator comprising:
   inverter means for amplifying an input signal having an input node and an output node, said inverter means including a CMOS inverter, said CMOS inverter including two transistors, a p-channel and an n-channel, the source of the p-channel connected to a source of supply, the drain of the p-channel connected to the drain of the n-channel at said output node, the source of the n-channel being connected to ground and the gates of said p-channel and said n-channel transistors being connected to said input node;
   first clamp means for clamping a first feedback signal from said output node to said input node of said means for amplifying an input signal, said first clamp means including a first a CMOS transistor with a gate terminal and a drain terminal connected to said output node and a source terminal respectively connected to said input node; and second clamp means for clamping a second feedback signal from said input node to said output node of said means for amplifying an input signal, said second clamp means including a second CMOS transistor with a gate terminal and a drain terminal connected to said input node and a source terminal respectively connected to said output node.

* * * * *